United States Patent

Katayama et al.

Patent Number: 5,978,941
Date of Patent: Nov. 2, 1999

[54] SEMICONDUCTOR MEMORY DEVICE HAVING DETERIORATION DETERMINING FUNCTION

[75] Inventors: Kunihiro Katayama, Yokohama; Takayuki Tamura, Kanagawa; Masashi Naito, Yokohama; Shigemasa Shiota, Kodaira, all of Japan

[73] Assignee: Hitachi, Ltd., Tokyo, Japan

[21] Appl. No.: 08/913,338

[22] PCT Filed: Mar. 15, 1995

[86] PCT No.: PCT/JP95/00429

§ 371 Date: Sep. 11, 1997

§ 102(e) Date: Sep. 11, 1997

[87] PCT Pub. No.: WO96/28826

PCT Pub. Date: Sep. 19, 1996

[51] Int. Cl.⁶ .................................................. G11C 29/00
[52] U.S. Cl. ........................................ 714/721; 714/718
[58] Field of Search ................................ 371/21.4, 21.1; 714/721, 718

[56] References Cited

FOREIGN PATENT DOCUMENTS

| | | |
|---|---|---|
| A-4-203439 | 7/1992 | Japan . |
| A-4-313080 | 11/1992 | Japan . |
| A-5-27924 | 2/1993 | Japan . |
| A-6-52694 | 2/1994 | Japan . |
| A-6-338195 | 12/1994 | Japan . |

*Primary Examiner*—Phung M. Chung
*Attorney, Agent, or Firm*—Antonelli, Terry, Stout & Kraus, LLP

[57] ABSTRACT

In a memory device using an electrically rewritable nonvolatile memory as a storage medium, wherein, in order to allow the memory to deteriorate evenly, the erasing time and writing time are measured, the influence of scatter of cells in the memory being eliminated on the basis of the resultant measurement values, a substantial degree of deterioration being thereby determined with a high accuracy, whereby a memory device of a high reliability and a high efficiency is practically obtained. In order to rewrite an electrically rewritable nonvolatile memory (1), there are provided a means for measuring the erasing time and writing time, a means for comparing an erasing time with a stored reference time, a means for correcting writing time on the basis of the results of the comparison, and a means for determining deterioration on the basis of the results of the correction. According to the present invention, the substantial deterioration of each cell can be determined, and such control is possible that more deteriorated memory is used less frequently while less deteriorated memory is used more frequently. As a result, the reliability of the memory is improved, and the memory can have a longer service life.

20 Claims, 16 Drawing Sheets

| ADRESS (22) | STATE OF DETERIORATION (23) |
|---|---|
| 0000 | DETERIORATION DEGREE 0 |
| 1000 | DETERIORATION DEGREE 2 |
| 2000 | DETERIORATION DEGREE 0 |
| 3000 | DETERIORATION DEGREE 0 |
| 4000 | DETERIORATION DEGREE 1 |
| 5000 | UNUSABLE |
| 6000 | DETERIORATION DEGREE 0 |
| 7000 | DETERIORATION DEGREE 0 |
| 8000 | DETERIORATION DEGREE 1 |
| 9000 | UNUSABLE |
| A000 | DETERIORATION DEGREE 2 |
| B000 | DETERIORATION DEGREE 2 |
| C000 | DETERIORATION DEGREE 0 |
| D000 | UNUSABLE |
| E000 | DETERIORATION DEGREE 2 |
| F000 | DETERIORATION DEGREE 2 |

21

(B)

| PHYPICAL ADDRESS (25) | STATE OF DETERIORATION (26) | LOGIC ADDRESS (27) | |
|---|---|---|---|
| 0000 | DETERIORATION DEGREE 0 | 5000 | ⎫ |
| 1000 | DETERIORATION DEGREE 2 | 1000 | |
| 2000 | DETERIORATION DEGREE 0 | 2000 | ADRESS SWAPPING |
| 3000 | DETERIORATION DEGREE 0 | 3000 | |
| 4000 | DETERIORATION DEGREE 1 | 4000 | |
| 5000 | DETERIORATION DEGREE 3 | 0000 | ⎭ |
| 6000 | DETERIORATION DEGREE 0 | 9000 | ⎫ |
| 7000 | DETERIORATION DEGREE 0 | 7000 | ADRESS SWAPPING |
| 8000 | DETERIORATION DEGREE 1 | 8000 | |
| 9000 | DETERIORATION DEGREE 3 | 6000 | ⎭ |
| A000 | DETERIORATION DEGREE 2 | A000 | |
| B000 | DETERIORATION DEGREE 2 | B000 | |
| C000 | DETERIORATION DEGREE 0 | D000 | ⎫ ADRESS SWAPPING |
| D000 | DETERIORATION DEGREE 3 | C000 | ⎭ |
| E000 | DETERIORATION DEGREE 2 | E000 | |
| F000 | DETERIORATION DEGREE 2 | F000 | |

24

FIG. 5
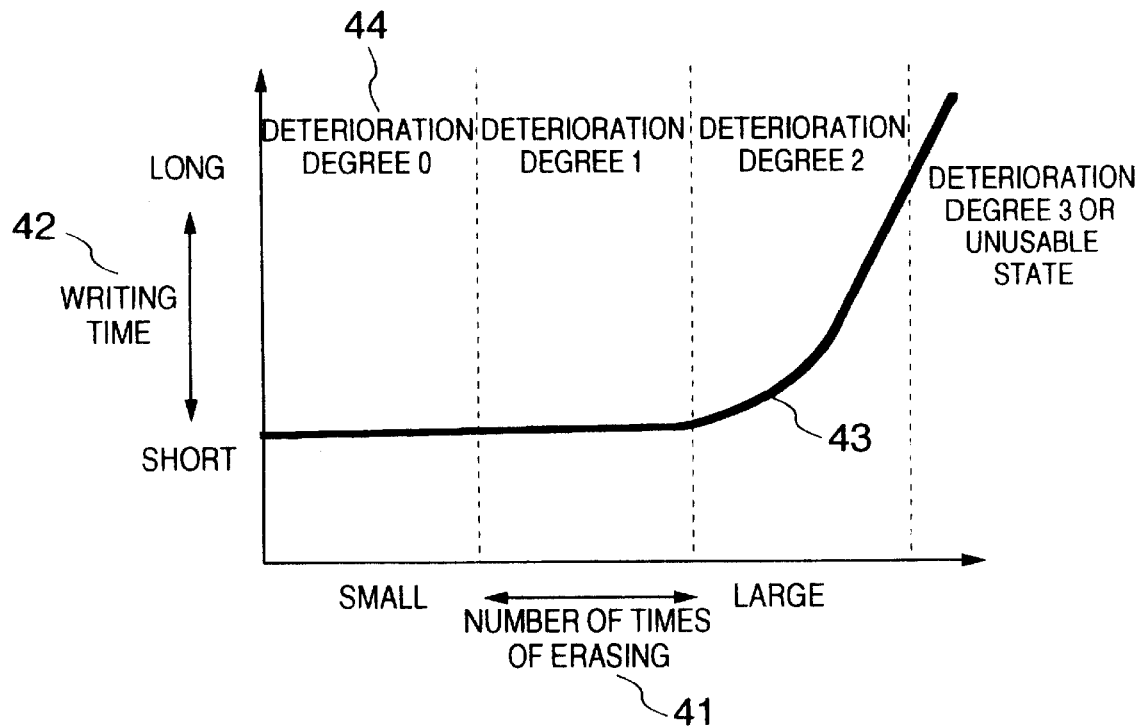
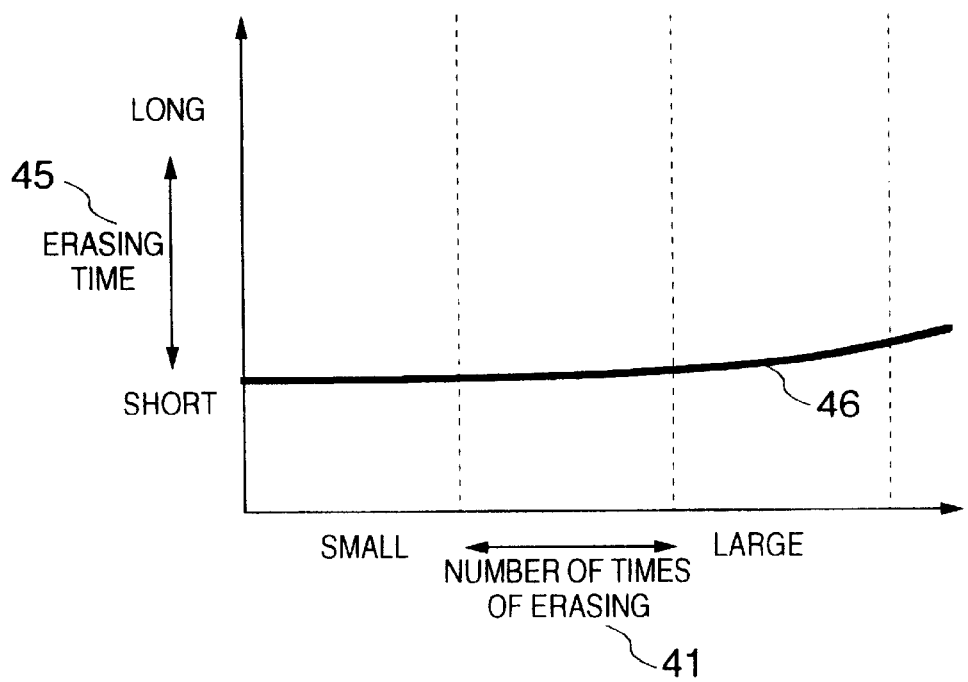

FIG. 6
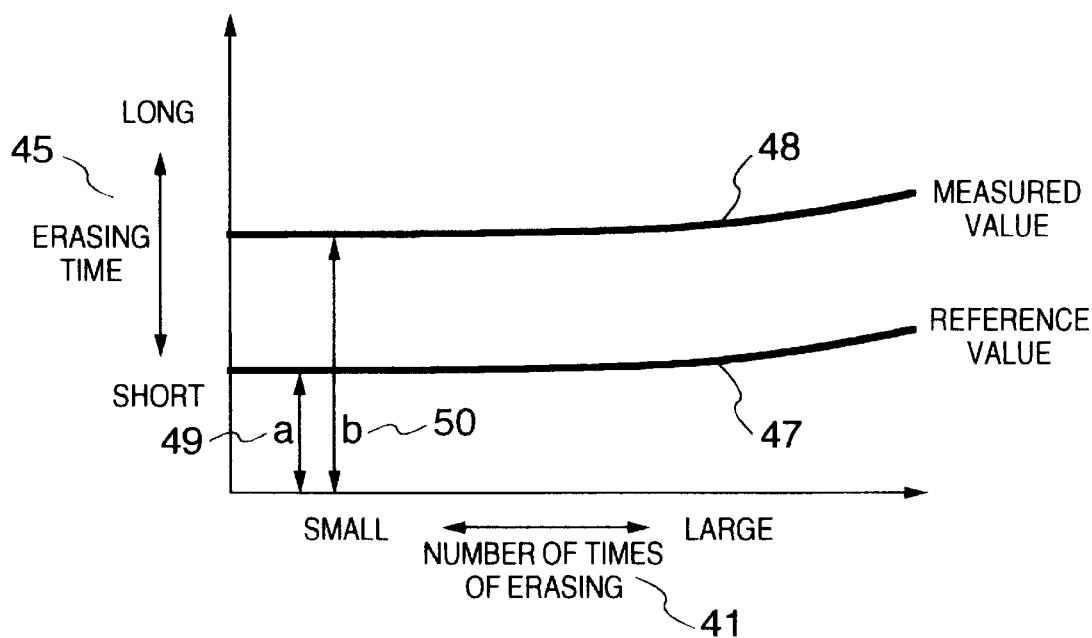
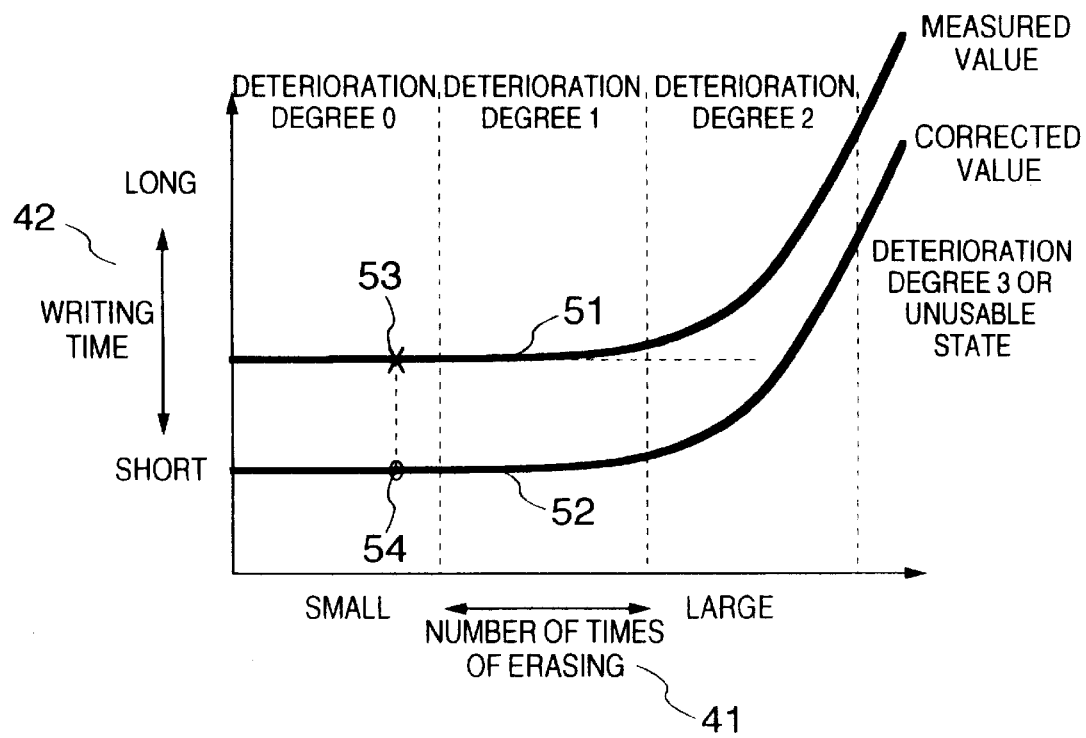

FIG. 11
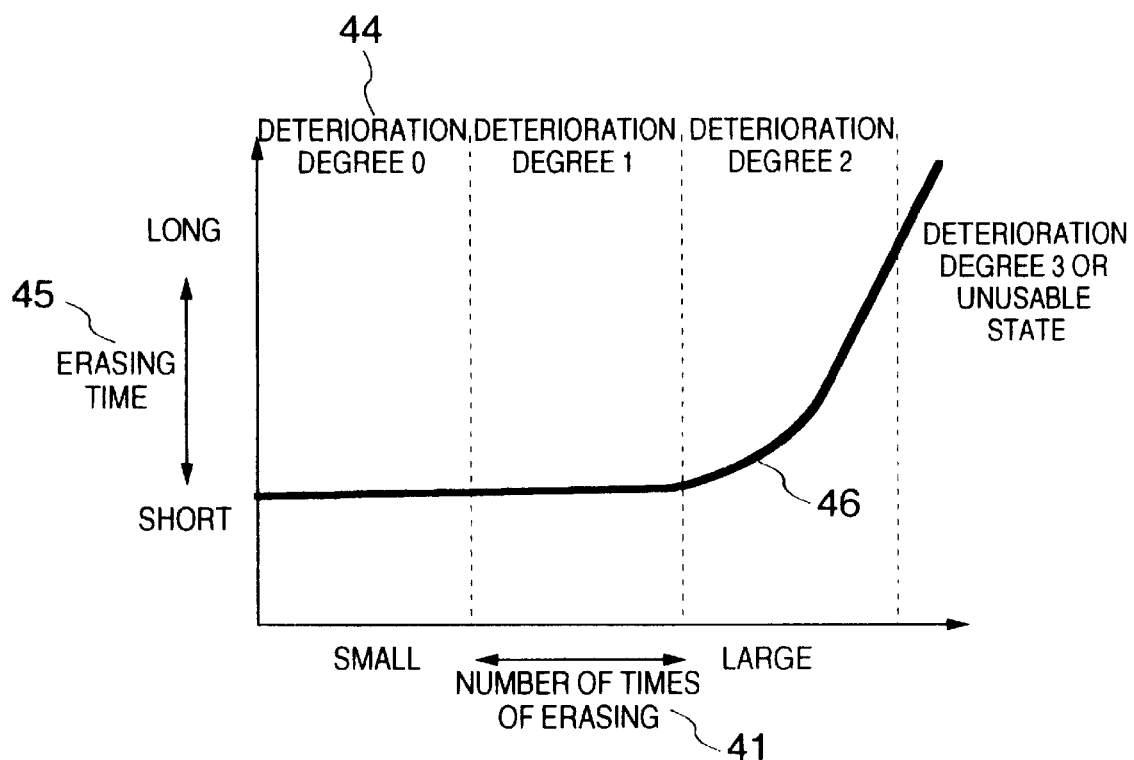
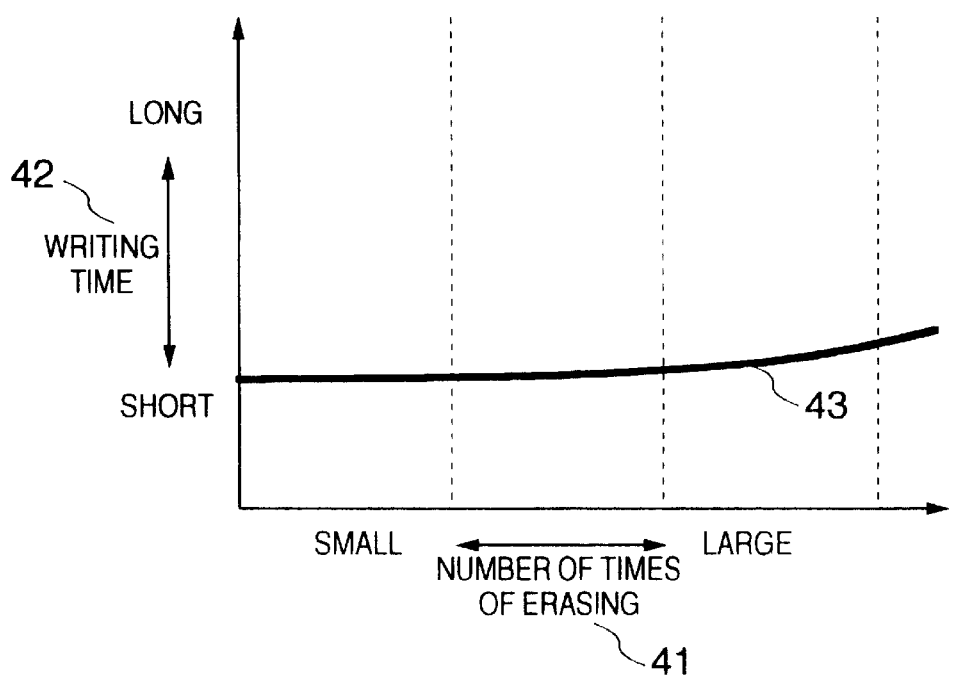

FIG. 12
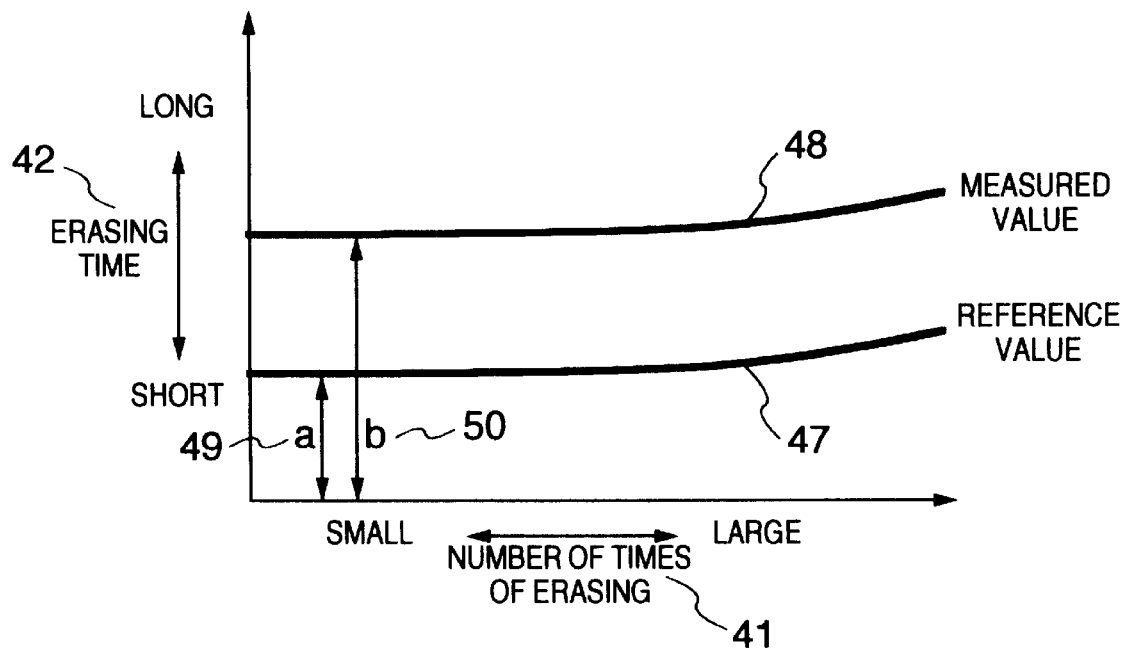
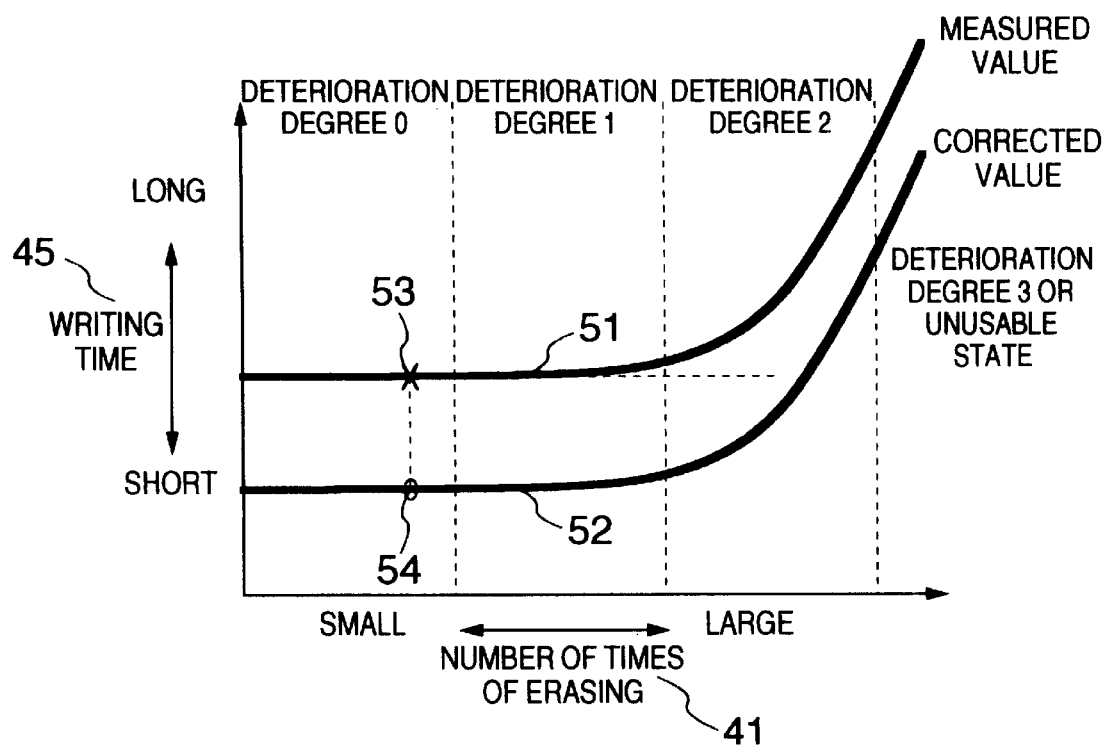

SEMICONDUCTOR MEMORY DEVICE HAVING DETERIORATION DETERMINING FUNCTION

TECHNICAL FIELD

The present invention relates to a memory device using an electrically rewritable nonvolatile semiconductor memory as a storage medium.

BACKGROUND ART

A magnetic disk device is the mainstream of a file data storage device in an information processing system such as a personal computer, or the like, at present. The magnetic disk device has a lot of merits such as low price, large capacity, high reliability, high performance, etc. and is most popular. With the gradual increase of demands for reduction in size, improvement in portability, reduction in consumed electric power, etc., a semiconductor memory device using a semiconductor as a recording medium has begun to be highlighted because the semiconductor memory device is more excellent in portability and low consumed electric power than the magnetic disk device.

A file device using a nonvolatile memory as a recording medium is disclosed in JP-A-5-27924. This technique concerns a memory device using a flash memory as a recording medium, and particularly discloses a system in which the life of a flash memory limited in the number of times of erasing required for rewriting is prolonged. Specifically, the number of times by which erasing is allowed is averaged for all regions in a file storage device which is apt to be rewritten locally, so that the apparent life is prolonged.

In the aforementioned invention, the number of times of erasing is used as an indicator for expressing deterioration of each flash memory cell and considered on the basis of the guaranteed value of the erasable number of times specified as characteristic data of the flash memory. The guaranteed value of the erasable number of times specified for each of various flash memories is, however, an average value or a minimum value in terms of characteristic, while the number of times by which erasing is allowed in practice varies according to the individual memory cells. That is, all the cells do not necessarily become unusable even when the number of times by which erasing is allowed reaches the guaranteed value. Accordingly, while the number of times by which erasing is allowed may be counted as an indicator for deterioration of each cell, there is some case where it cannot be said that memory cells are used most efficiently.

Therefore, an object of the present invention is to provide a method or semiconductor memory device in which deterioration of a memory can be grasped without consciousness of the guaranteed number of times and the current number of times by which the aforementioned electrically erasable/rewritable nonvolatile memory is allowed to be erased/rewritten, and, further, to provide a memory management method or semiconductor memory device using the same.

Another object of the present invention is to provide a method or semiconductor memory device in which the aforementioned electrically erasable/rewritable nonvolatile memory can be used up to the detected actual erasable/rewritable limit.

A further object of the present invention is to provide a method or semiconductor memory device for detecting the number of times by which the aforementioned electrically erasable/rewritable nonvolatile memory is allowed to be actually erased/rewritten.

DISCLOSURE OF THE INVENTION

In order to achieve the above objects, according to the present invention, in a semiconductor memory device using an electrically rewritable nonvolatile memory as a storage medium, there are provided: an erasing time measurement means for measuring erasing time required for erasing of the nonvolatile memory; a characteristic detection means for comparing the erasing time measured by the erasing time measurement means with an erasing time reference value to thereby determine environmental characteristic; a writing time measurement means for measuring writing time required for writing of the nonvolatile memory; a correction means for correcting the writing time measured by the writing time measurement means on the basis of the environmental characteristic determined by the characteristic detection means; and a nonvolatile memory deterioration determining means for detecting a degree of deterioration in a rewriting region of the nonvolatile memory on the basis of the corrected writing time.

Further, according to the present invention, in a semiconductor memory device using an electrically rewritable nonvolatile memory as a storage medium, there are provided: an electric source voltage detection means for detecting an electric source voltage value applied to the nonvolatile memory; a temperature detection means for detecting an ambient temperature of the semiconductor memory device; a characteristic detection means for determining environmental characteristic from detection values of the electric source voltage detection means and the temperature detection means; a writing time measurement means for measuring writing time required for writing of the nonvolatile memory; a correction means for correcting the writing time measured by the writing time measurement means on the basis of the environmental characteristic determined by the characteristic detection means; and a nonvolatile memory deterioration determining means for detecting a degree of deterioration in a rewriting region of the nonvolatile memory on the basis of the corrected writing time.

Further, according to the present invention, in a semiconductor memory device using an electrically rewritable nonvolatile memory as a storage medium, here are provided: an erasing time measurement means for measuring erasing time required for erasing of the nonvolatile memory; a writing time measurement means for measuring writing time required for writing of the nonvolatile memory; a characteristic detection means for comparing the writing time measured by the writing time measurement means with a writing time reference value to thereby determine environmental characteristic; a correction means for correcting the erasing time measured by the erasing time measurement means on the basis of the environmental characteristic determined by the characteristic detection means; and a nonvolatile memory deterioration determining means for detecting a degree of deterioration in a rewriting region of the nonvolatile memory on the basis of the corrected erasing time.

Further, according to the present invention, in a semiconductor memory device using an electrically rewritable nonvolatile memory as a storage medium, there are provided: an electric source voltage detection means for detecting an electric source voltage value applied to the nonvolatile memory; a temperature detection means for detecting an ambient temperature of the semiconductor memory device; a characteristic detection means for determining environmental characteristic from detection values of the electric source voltage detection means and the temperature detection means; an erasing time measurement means for measuring erasing time required for erasing of the nonvolatile memory; a correction means or correcting the erasing time measured by the erasing time measurement means on the basis of the environmental characteristic determined by the characteristic detection means; and a nonvolatile memory deterioration determining means for detecting a degree of deterioration in a rewriting region of the nonvolatile memory on the basis of the corrected erasing time.

Further, according to the present invention, in the above-mentioned semiconductor memory device, there are further provided: a deterioration-degree storage means for storing a degree of deterioration in every region detected by the nonvolatile memory deterioration determining means while the degree of deterioration in each of the regions is divided into a plurality of stages; a deterioration degree comparing means for comparing a degree of deterioration determined at the time of rewriting of each region with the degree of deterioration determined at the time of previous rewriting and stored in the deterioration-degree storage means; a low-deterioration-degree-region retrieval means for detecting a region having the lowest degree of deterioration among all regions; stored data of a region in which progression of deterioration is found as a result of comparison executed by the deterioration degree comparing means; and a data exchange means for exchanging the stored data in a region detected by the a low-deterioration-degree retrieval means.

Further, according to the present invention, in the above-mentioned semiconductor memory device, when the corrected erasing time or the corrected writing time exceeds a predetermined value, the nonvolatile memory deterioration determining means makes a determination that the degree of deterioration is in an unusable state and treats the maximum one of the degree of deterioration divided into the plurality of stages as the degree of deterioration in the unusable state to thereby prohibit data storage thereafter.

Further, according to the present invention, in the above-mentioned semiconductor memory device, the deterioration degree detection means is provided in the inside of the electrically rewritable nonvolatile memory.

Further, according to the present invention, in an information processing system comprising: a central processing unit for performing processing of program or data; a main memory for temporarily storing the program or data to be used by the central processing unit; a basic program memory which stores programs at the time of start and programs such as basic input/output instructions; a display control means and a display means for displaying a state of operation, a result of process, and so on; an input means for inputting a processing request; and a communication control means for performing data exchange or the like with other information processing systems; the aforementioned semiconductor memory device is provided as an auxiliary memory device.

The nonvolatile memory as a recording medium in a storage device is rewritten by region or chip having various data. An erasing operation and a writing operation are required for rewriting the nonvolatile memory. In each of the operations, inputting or controlling signals determined in accordance with the memory and a certain degree of time are required. Further, most of nonvolatile memories have properties in which the change of the time required for erasing operation is relatively small and the change of the time required for writing operation is very large with respect to the progress of deterioration or, conversely, the change of the time required for writing operation is relatively small and the change of the time required for erasing operation is very large with respect to the progress of deterioration.

Using these properties, the aforementioned writing time measurement means or the erasing time measurement means measures the change of the writing time or easing time of the nonvolatile memory as a recording medium so that a substantial degree of deterioration can be detected. That is, the degree of deterioration of every cell can be obtained while the scattering of characteristic is taken into account. Accordingly, not only reliability can be improved but also the memory can be used until the life of the memory approaches its limit.

Further, the nonvolatile memory is apt to be influenced by environmental conditions such as an electric source voltage value, an ambient temperature, etc. The time required for easing operation and the time required for writing operation correlate, to some degree, with the way of reception of the influence of such environmental conditions. When this property is used, for example, in the case where the change of the time required for erasing operation is relatively small and the change of the time required for writing operation is very large, the change of the time required for erasing operation can be regarded as the influence of such environmental conditions. When the time required for writing operation is corrected on the basis of the change of the time required for erasing operation, the influence of such environmental conditions can be eliminated so that deterioration can be judged.

Further, the nonvolatile memory deterioration determining means may measure the environmental conditions such as an electric source voltage value, an ambient temperature, etc. directly to thereby correct the change of the writing time or erasing time to judge deterioration. As a result, accuracy in the degree of deterioration is improved, so that this measure is of practical use. Further, this measure can be applied to a memory having properties in which both the time required for writing operation and the time required for erasing operation change remarkably because of deterioration.

When averaging the degree of deterioration in respective cells is attained on the basis of the degree of deterioration detected by the aforementioned means, the reliability and prolongation of life are improved greatly.

Further, when the aforementioned semiconductor memory device is used as an auxiliary storage device in an information processing system, the reliability of the information processing system per se can be improved and the life thereof can be prolonged.

BRIEF DESCRIPTION OF THE DRAWINGS

FIG. 4 is a diagram showing an example of recording of the degree of deterioration and logical addresses in the case where the degree of deterioration determined according to the present invention is applied to a region unit;

FIG. 5 is a graph showing the change of the writing time and the change of the erasing time accompanying the change of the nonvolatile memory used in the first invention;

FIG. 6 is a graph showing an example of correction of the writing time in the case where environmental conditions in the nonvolatile memory used in the first invention change;

FIG. 11 is a graph showing a deterioration correlation curve of the nonvolatile memory in which the erasing time is prolonged with the progress of deterioration;

FIG. 12 is a graph showing an example of correction of the erasing time in the case where environmental conditions change in the nonvolatile memory in which the erasing time is prolonged with the progress of deterioration;

BEST MODE FOR CARRYING OUT THE INVENTION

Figure 1:
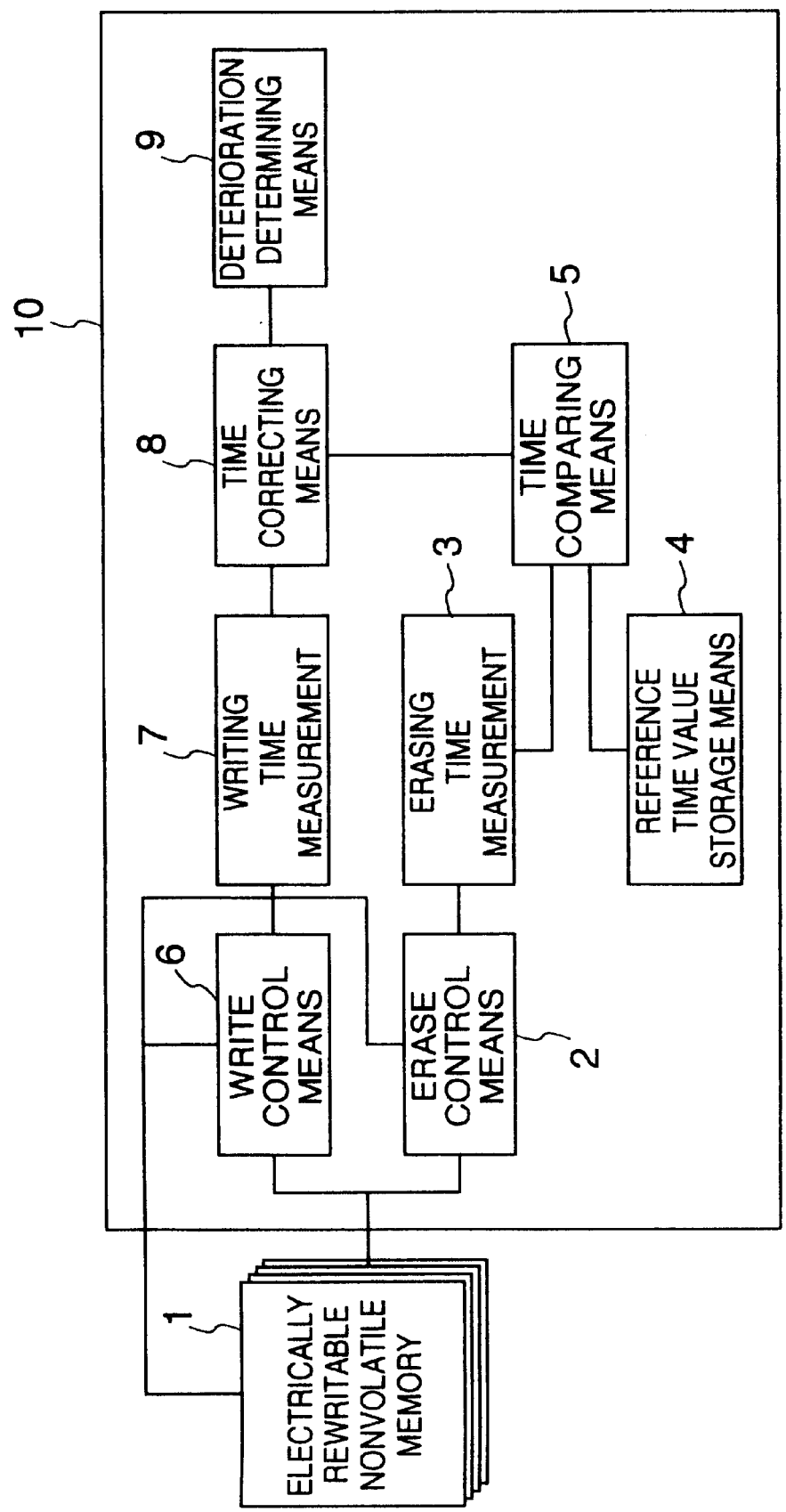
FIG. 1 is a diagram showing an overall configuration for achieving a first invention.

FIG. 1 is a configuration diagram of a first embodiment of the present invention. In FIG. 1, the reference numeral 1 designates an electrically rewritable nonvolatile memory which is a storage medium in a memory device according to the present invention. As shown in FIG. 5, the nonvolatile memory 1 has properties in which the change of the time required for erasing operation is relatively small and the change of the time required for writing operation is large with respect to the progress of deterioration.

The reference numeral 2 designates an erase control means for controlling the nonvolatile memory 1 to erase partly or wholly data in the nonvolatile memory 1; 3, an easing time measurement means for measuring the time required for erasing performed by the erase control means 2; 4, a reference time value storage means for storing a reference value of the erasing time for the nonvolatile memory 1 in advance; 5, a characteristic detecting means (hereinafter referred to as time comparing means) for comparing the erasing time value measured by the erasing time measurement means 3 with the reference time value stored in the reference time value storage means 4 to thereby detect an environmental characteristic coefficient; 6, a write control means for controlling the nonvolatile memory 1 to write data into the nonvolatile memory 1; 7, a writing time measurement means for measuring the time required for writing performed by the write control means 6; 8, a time correcting means for correcting the time value measured by the writing time measurement means 7 on the basis of the environmental characteristic coefficient obtained by the time comparing means 5; 9, a deterioration determining means for determining the degree of deterioration in an objective region or chip of the nonvolatile memory 1 on the basis of the time value corrected by the time correcting means 8 and outputting the degree of deterioration; and 10, a deterioration determining device including all the aforementioned means.

The operation will be described below. A sector management device which will be described later instructs the erase control means 2 and the write control means 6 to erase data from a controlled position of the nonvolatile memory 1 and write data into the controlled position of the nonvolatile memory 1 in accordance with the nonvolatile memory 1 rewriting operation carried out by a host information apparatus (hereinafter referred to as host). The erase control means 2 and the write control means 6 perform erasing and writing respectively whereas the erasing time measurement means 3 and the writing time measurement means 7 measure required time respectively. The required time can be measured on the basis of a signal which is outputted from each memory 1 in order to exhibit an operating state.

The time comparing means 5 compares the measured erasing time with the reference value of the erasing time to thereby obtain an environmental characteristic coefficient expressing the influence of an environmental condition. Further, the time correcting means 8 corrects the writing time on the basis of the environmental characteristic coefficient, and then the deterioration determining means 9 grasps the degree of the actual progress of deterioration on the basis of the results of the measurement of the writing time and outputs the degree of the actual progress of deterioration. Incidentally, the aforementioned respective means can be achieved by a combination of logic devices using semiconductors. Further, the writing time measurement means and the erasing time measurement means can be achieved by a signal time measurement means.

According to this embodiment, the aforementioned respective means can be achieved by a combination of logic devices so as to be constructed in the inside of a memory chip. That is, when the aforementioned deterioration determining device is partly or wholly incorporated in the inside of a chip of the nonvolatile memory 1, the number of parts on the whole of the device can be reduced.

Further, as for another effect of this embodiment, this embodiment can be applied to memory chips having various characteristics if the reference time value stored in the reference time value storage means is changed. Further, the same effect as described above can be obtained when the correcting method used in the time correcting means is changed.

An embodiment in which the present invention is achieved by control based on a microprocessor and by a combination circuit using logic devices will be described below.

Figure 2:
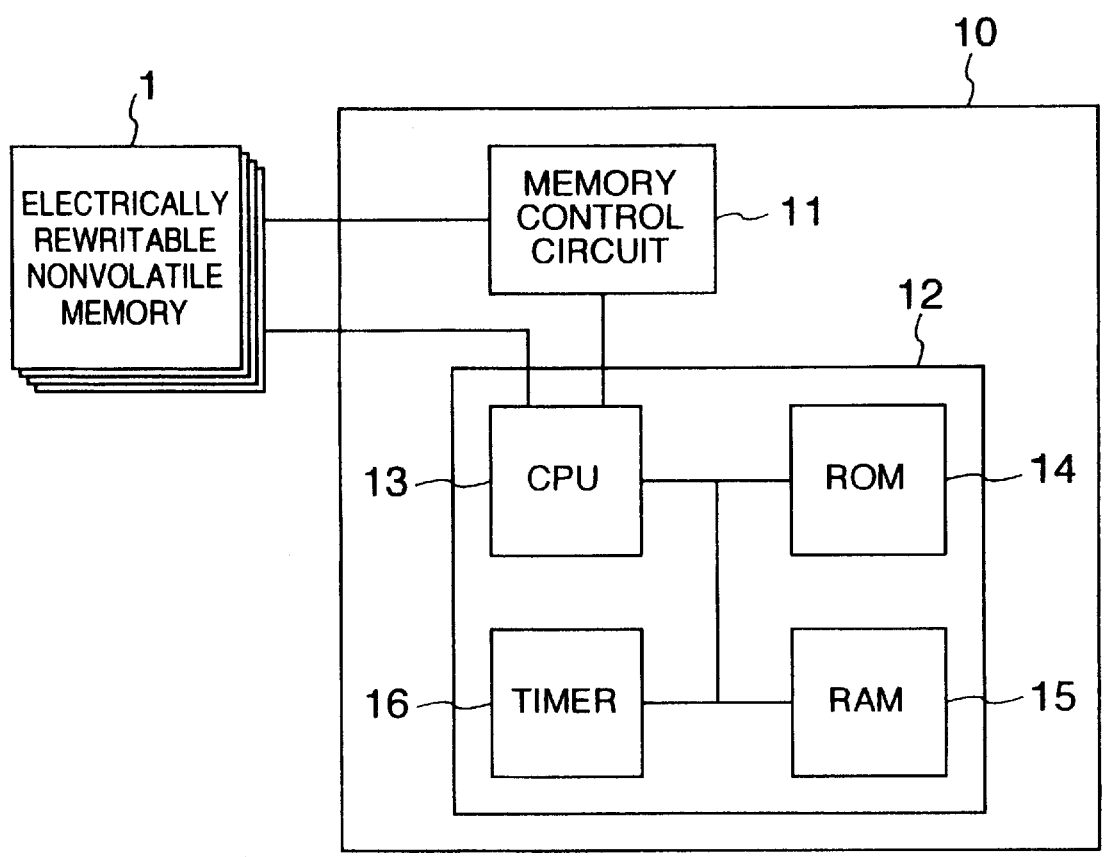
FIG. 2 is a configuration diagram of an embodiment of the first invention using a one-chip microcomputer.

FIG. 2 is a configuration diagram for achieving this embodiment. In FIG. 2, the reference numeral 11 designates a memory control circuit for generating a signal for controlling the electrically rewritable nonvolatile memory 1; 12, a one-chip microcomputer having a microprocessor, peripheral circuits thereof, etc. accommodated in one chip; 13, a microprocessor (hereinafter referred to as CPU) contained in the microcomputer; 14, a program memory (hereinafter referred to as ROM) in which the content of processing to be executed by the CPU 13 is stored as a program; 15, a work memory (hereinafter referred to as RAM) which is required in processing executed by the CPU 13; and 16, a timer circuit mounted on the one-chip microcomputer 12 in order to measure time.

Figure 3:
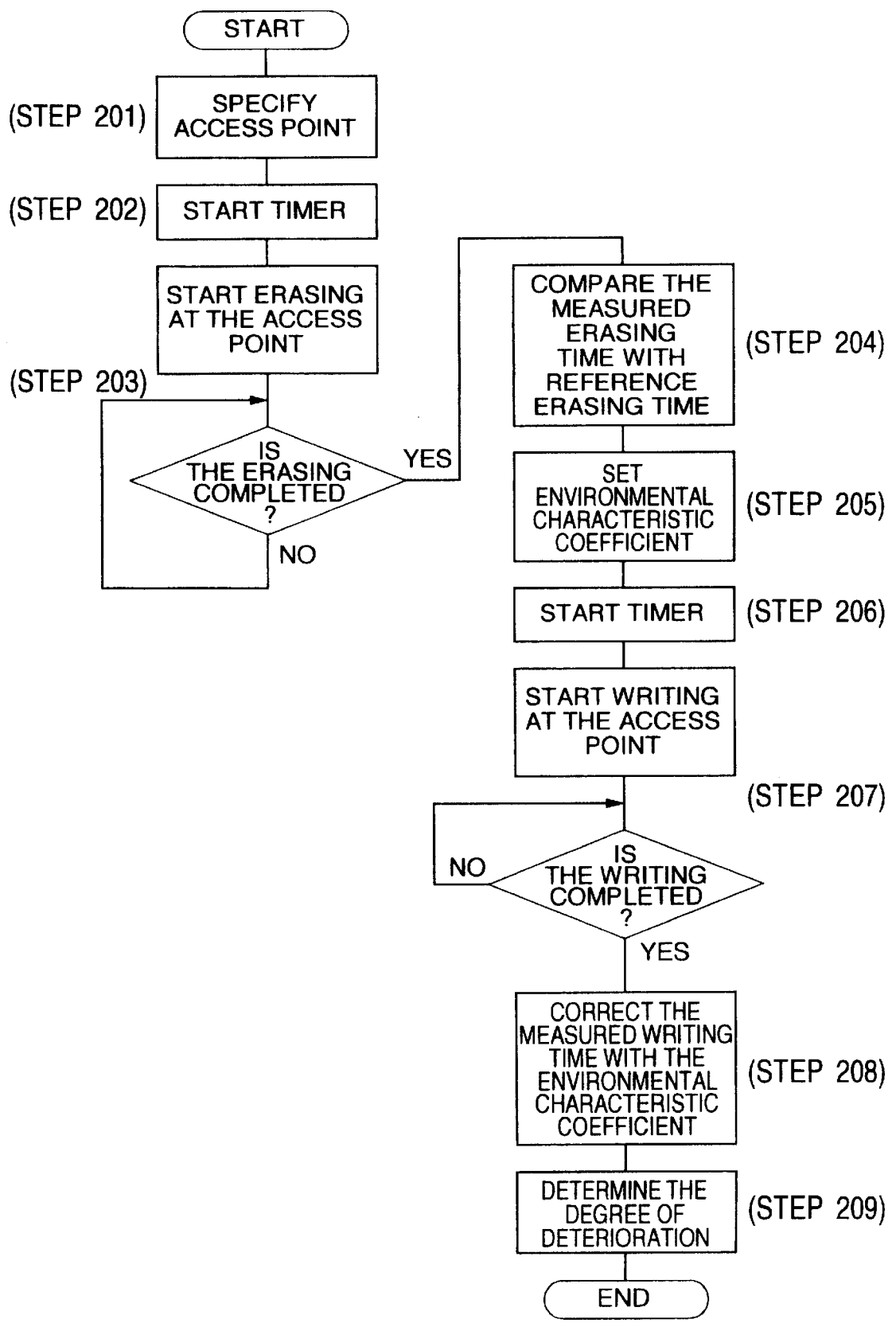
FIG. 3 is a flow chart of a control program in the microcomputer in the embodiment depicted in FIG. 2.

FIG. 3 is a flow chart showing the content of processing to be executed by the CPU 13, that is, the content of a program stored in the ROM 14. In this embodiment, the CPU 13 executes the operations of the respective means in the aforementioned embodiment on the basis of the program.

The operation will be described below mainly using the flow chart of FIG. 3.

The memory device according to the present invention operates in accordance with an access request from a host not shown. FIG. 3 shows the operation of the memory device after a write access request for a specific logical address is given from a host.

First, an access point is specified on the basis of the logical address required to be accessed (step 201). Then, the timer 16 is started in order to measure the time required for erasing a region or chip as a subject to be accessed (step 202).

Then, the memory control circuit 11 is instructed to erase the access point, so that the memory control circuit 11 waits for the completion of erasing while watching the signal outputted from the nonvolatile memory 11 (step 203).

After the completion of erasing, the time required for erasing is read from the timer 16 and compared with the reference erasing time stored in the ROM 14, or the like, in advance (step 204). Then, an environmental characteristic coefficient is calculated on the basis of the comparison (step 205).

Then, the timer 16 is started again in order to measure the time required for writing data into the erased region or chip (step 206).

Then, the memory control circuit 11 is instructed to write data and waits for the completion of writing in the same manner as in erasing (step 207).

After the completion of writing, the measured writing time is corrected on the basis of the preliminarily obtained environmental characteristic coefficient (step 208) and the degree of deterioration is determined on the basis of the corrected writing time value (step 209).

Thus, the operation of determining the degree of deterioration is completed. Although this drawing shows an example of the internal configuration of the one-chip microcomputer 12, the timer 16 need not always be contained. The timer may be replaced by a program executed by the CPU 13 or may be provided as an external circuit of the one-chip microcomputer 12. The microcomputer may be also achieved by a configuration in which the CPU 13, the ROM 14, the RAM 15, etc. are not incorporated in one chip. According to this embodiment, the degree of deterioration can be determined flexibly because this embodiment can be applied to various characteristics of the memory 1 on the basis of the program stored in the ROM 14.

Figure 16:
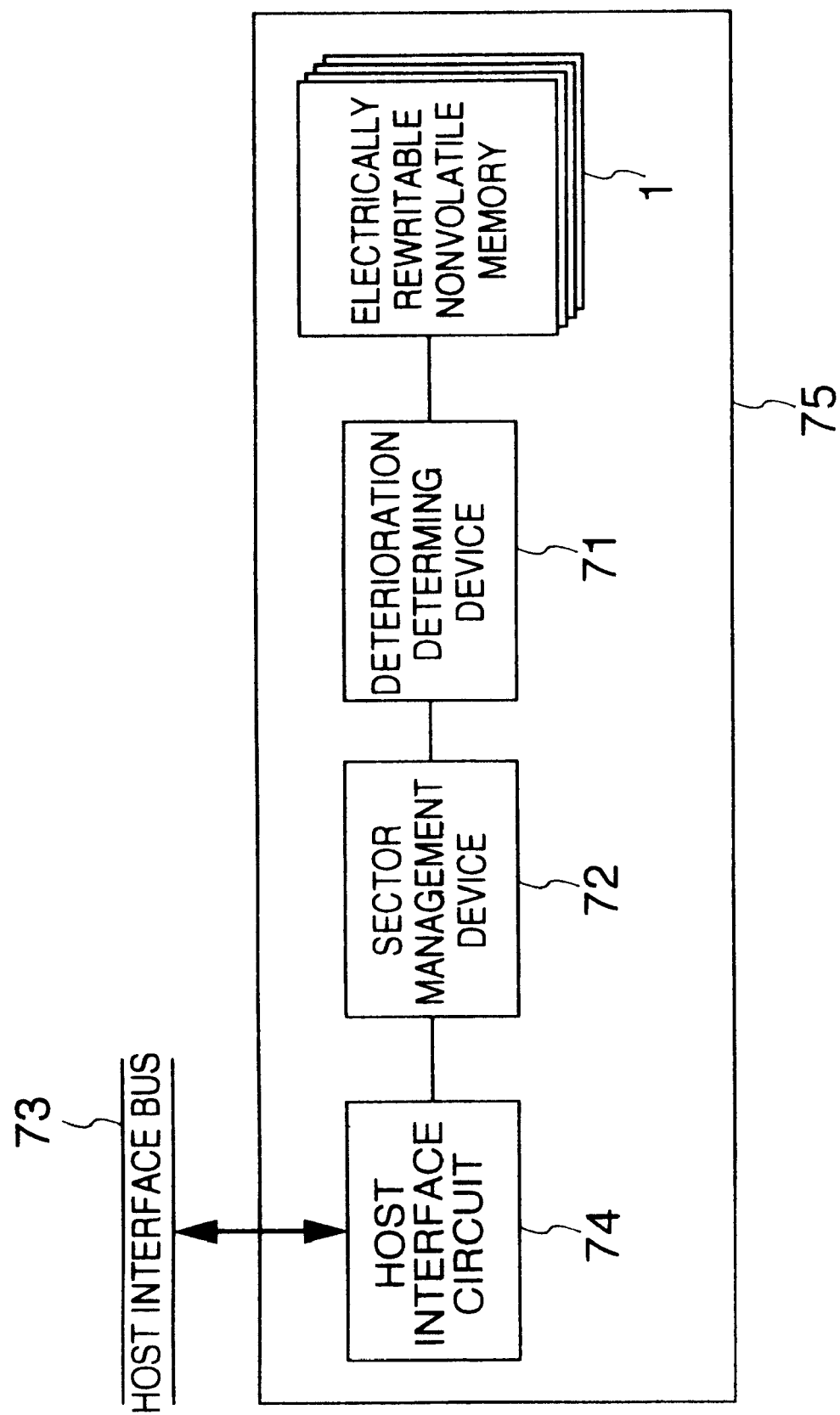
FIG. 16 is a configuration diagram of an auxiliary storage device to which the deterioration determining device according to the present invention is applied.

FIG. 16 is a configuration diagram of an auxiliary memory device using the semiconductor memory device according to the embodiment shown in FIG. 1 or 2. In FIG. 16, the reference numeral 71 designates a deterioration determining device shown in FIG. 1 or 2; and 72, a sector management device for managing file data for each sector on the basis of the results of determination in the deterioration determining device 71. Incidentally, the sector is a unit of stored data capacity on the management of file data and is also a unit of rewriting in the electrically rewritable non-volatile memory. The reference numeral 73 designates an interface bus for performing exchange of information with the host; and 74, a host interface circuit for controlling setting registers, input/ output signals, etc. for the host to access the stored data of the nonvolatile memory 1 through the host interface bus 73. For example, an interface circuit according to the PCMCIA standard is applicable to this host interface circuit. The reference numeral 75 designates an auxiliary memory device constituted by the nonvolatile memory 1 and the aforementioned devices and circuits. For example, an IC memory card is applicable to this auxiliary memory device.

The host sets access contents in the setting registers in the inside of the host interface circuit 74 and makes an arbitrary access request. Upon reception of the request, the host interface circuit 74 transmits an access request address to the sector management device 72. The sector management device 72 converts the request address into the physical address of the nonvolatile memory 1. The sector management device 72 which grasps the state of each physical sector in the nonvolatile memory 1 determines a write sector in the write access on the basis of the state of each physical sector. Further, the sector management device 72 designates a physical sector address to be accessed and makes the erase control means 2 or write control means 6 in the deterioration determining device 71 access the physical sector address.

After the completion of accessing, the deterioration determining device 71 outputs the results of determination of deterioration. The sector management device 72 records the results. The state of deterioration is stored in a nonvolatile memory region provided in the sector management device 72. If a region for storing the state of deterioration for each sector, etc. is provided in the nonvolatile memory 1, the state of deterioration may be recorded in the region. Incidentally, the unit of stored data capacity on the management of file data may be used so as to be different from the unit of rewriting in the electrically rewritable nonvolatile memory in accordance with the file management method.

An embodiment of the data management method used in the sector management device 72 will be described below. FIG. 4 shows an example in which the degree of deterioration as the degree of the progress of deterioration is managed while classified into four stages. The diagram (A) of FIG. 4 shows an example in which the state of the most progress of the degree of deterioration is regarded as an unusable state so that use after that is stopped. The diagram (B) of FIG. 4 shows an example in which addresses are exchanged so that the region having the degree of deterioration reaching the fourth stage is replaced by the region of the less progress of the degree of deterioration. Thus, the addresses are managed under classification into physical addresses and logical addresses. In each example, the nonvolatile memory 1 as a recording medium is managed while the degree of deterioration is grasped for each region of 4 Kbytes. In FIG. 4, the reference numeral 21 designates contents of the storage means which manages the state of deterioration. As described above with reference to FIG. 16, the data are stored in the nonvolatile memory in order to manage each sector. As for the place for storing the data, the data may be stored in a storage region accompanying the nonvolatile memory region or may be stored in another storage means.

The reference numeral 22 designates physical addresses allocated to the nonvolatile memory in the case of (A). In this case, the physical addresses also serve as logical addresses. In a file storage device, data are generally managed in every large block such as a sector, or the like. This case can be applied to data management in every 4 kbytes.

This rule can be applied to logical addresses 27 in the case of (B). The reference numeral 23 designates the content of the state of deterioration in every region. The content 23 of the state of deterioration has a storage capacity of two bits and is classified into four stages. The reference numeral 24 designates a deterioration state storage means in the case of (B). This means 24 is equivalent to the means 21. The unusable state in the case of (A) is made the degree 3 of deterioration. The reference numeral 25 designates physical addresses allocated to the nonvolatile memory. The reference numeral 26 designates the content of the state of deterioration. The content 26 of the state of deterioration has a storage capacity of two bits in the same manner as in the content 23.

The reference numeral 27 designates logical addresses for data management as described above. In the case of a file storage device, the logical address does not require the same number of digits as in the physical address. In the case of (A), a region having a larger degree of deterioration than 2 is registered as an unusable state by the sector management device 72 so that an access request to this region is not accepted. Further, file rewriting is carried out while the progress of the degree of deterioration is checked so that a less deteriorated region is selected. In the case of (B), the degree of deterioration is classified into four stages. The address of a region having the degree 3 of deterioration is replaced by the address of a less deteriorated region having the degree 0 of deterioration by the sector management device 72 so that the region having the degree 3 of deterioration is not deteriorated any more.

As a result, a less deteriorated region, that is, a less-frequently rewritten region is assigned so that the progress of deterioration can be suppressed. In this case, because logical addresses are replaced by each other, a degree of deterioration and a logical address value are recorded so as to correspond to each other in each region of the nonvolatile memory. The storage means for this may be disposed in the nonvolatile memory 1 or the degree of deterioration and the logical address value may be stored so as to correspond to each other in any other storage means.

Incidentally, when the replacement of addresses is performed whenever the degree of deterioration progresses by one stage, the classification of the degree of deterioration into three or more is more effective. When, for example, a region reaching the degree 1 of deterioration is replaced by a region having the degree 0 of deterioration, and a region reaching the degree 2 of deterioration is replaced by a region having the degree 0 of deterioration if there is the region having the degree 0 of deterioration or replaced by a region having the degree 1 of deterioration if there is no region having the degree 0 of deterioration, the averaging is performed more accurately.

Although both the diagrams (A) and (B) show the case where the degree of deterioration is classified into four stages, the averaging can be performed more accurately if the degree of deterioration is classified into eight or sixteen stages. Further, when the most deteriorated stage in the diagram (B) is made to be an unusable state, safety increases.

FIGS. 5 and 6 show an actual example of determination of the degree of deterioration in the first embodiment. In the first embodiment, the nonvolatile memory 1 has characteristic in which the writing time increases but the erasing time does not change relatively as deterioration progresses.

FIG. 5 is a graph showing the general change of the writing time and the general change of the erasing time accompanying the increase in the number of times of erasing. In FIG. 5, the reference numeral 41 designates the number of times by which erasing has been made. As the number of times by which erasing has been made increases, deterioration progresses. The correlation between the number of times by which erasing has been made and the progress of deterioration varies in accordance with the structure of the memory, chip characteristic and each region in a memory chip. Incidentally, environmental conditions such as an electric source voltage, an ambient temperature, etc. are considered to be not changed. The reference numeral 42 designates writing time; 43, a correlation curve in the respective degrees of deterioration; 44, split lines in the case where the degree of deterioration is classified into four stages which show the degree 0 of deterioration, the degree 1 of deterioration, the degree 2 of deterioration and the degree of deterioration or an unusable state in rightward order; 45, erasing time; and 46, a correlation curve between the number of times by which erasing has been made and the erasing time. The writing time has a tendency in which the time increases slowly before a certain time point, and the time increases rapidly after the certain time point. On the other hand, the change of the erasing time is small as a whole.

FIG. 6 shows the change of a correlation curve in the case where environmental conditions change. The reference numeral 47 designates a correlation curve in average conditions. This correlation curve is made to be a reference value. The reference numeral 48 designates a curve expressing a value measured in a certain use condition in the case where environmental conditions change; 49, a reference erasing time value a in a certain deterioration state; 50, a measured erasing time value b n the same deterioration state; 51, a writing time measurement curve measured in the same condition as in the erasing time curve 48; 52, a writing time correction curve which is corrected on the basis of the ratio of the reference erasing time value a 49 to the measured erasing time value b 50; 53, a writing time measurement value in a certain deterioration state; and 54, a writing time correction value in a certain deterioration state. If the erasing time value 50 and the writing time value 53 are obtained in a certain deterioration state and in a certain environmental condition, the corrected writing time value 54 can be obtained.

Incidentally, the degree of deterioration obtained from the curve need not be always classified into four stages, but may be classified into eight or sixteen stages. Although the drawing shows the case where the degree of deterioration is divided, on the curve, substantially at equal intervals with respect to the number of times of erasing, the interval of division of the degree of deterioration may be made more delicately, for example, as the time increases, in accordance with the characteristic of the memory and the method of controlling the memory.

Figure 13:
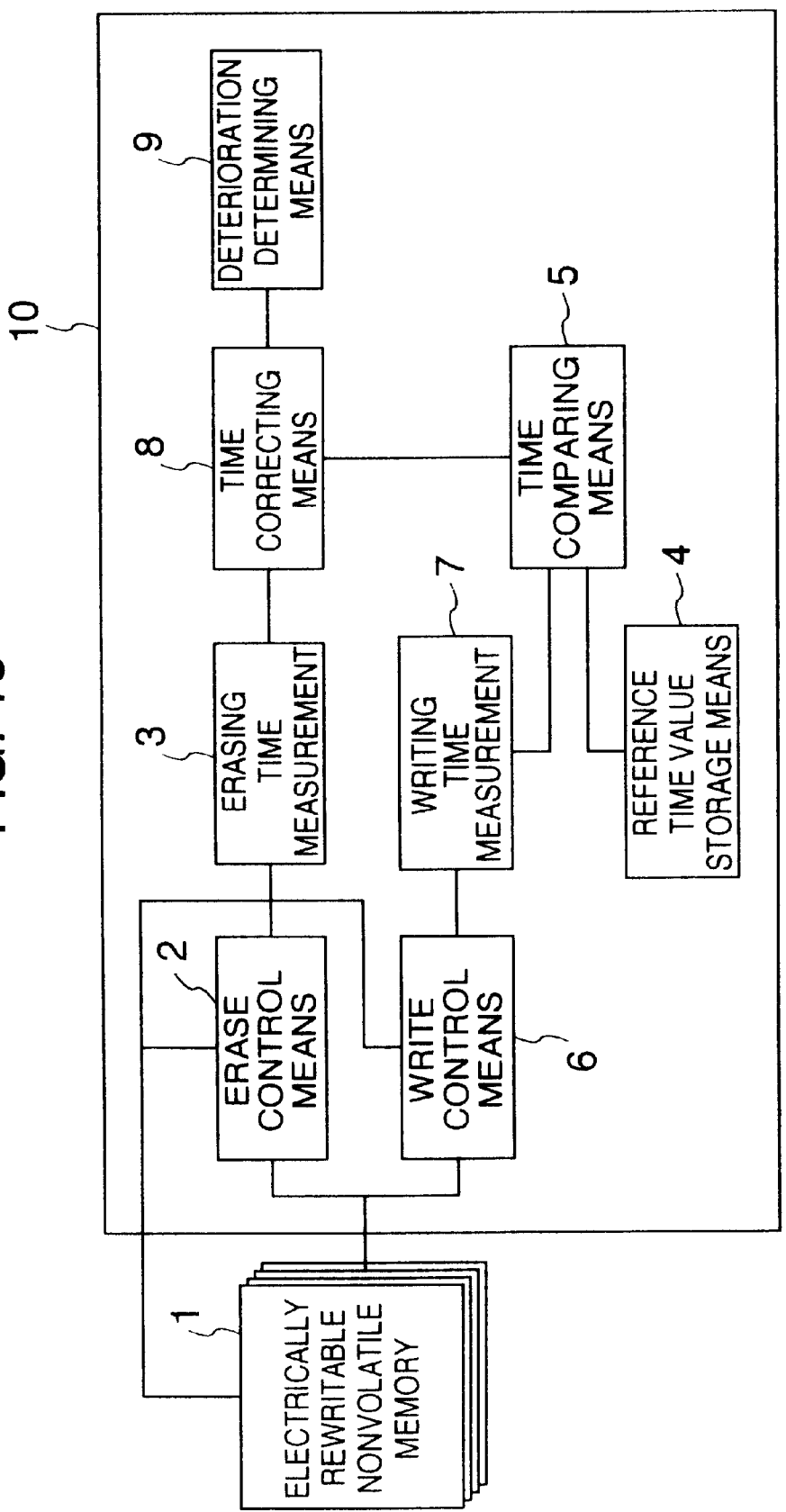
FIG. 13 is an overall configuration diagram of the present invention in the case where the nonvolatile memory in which the erasing time is prolonged with the progress of deterioration is used.
Figure 14:
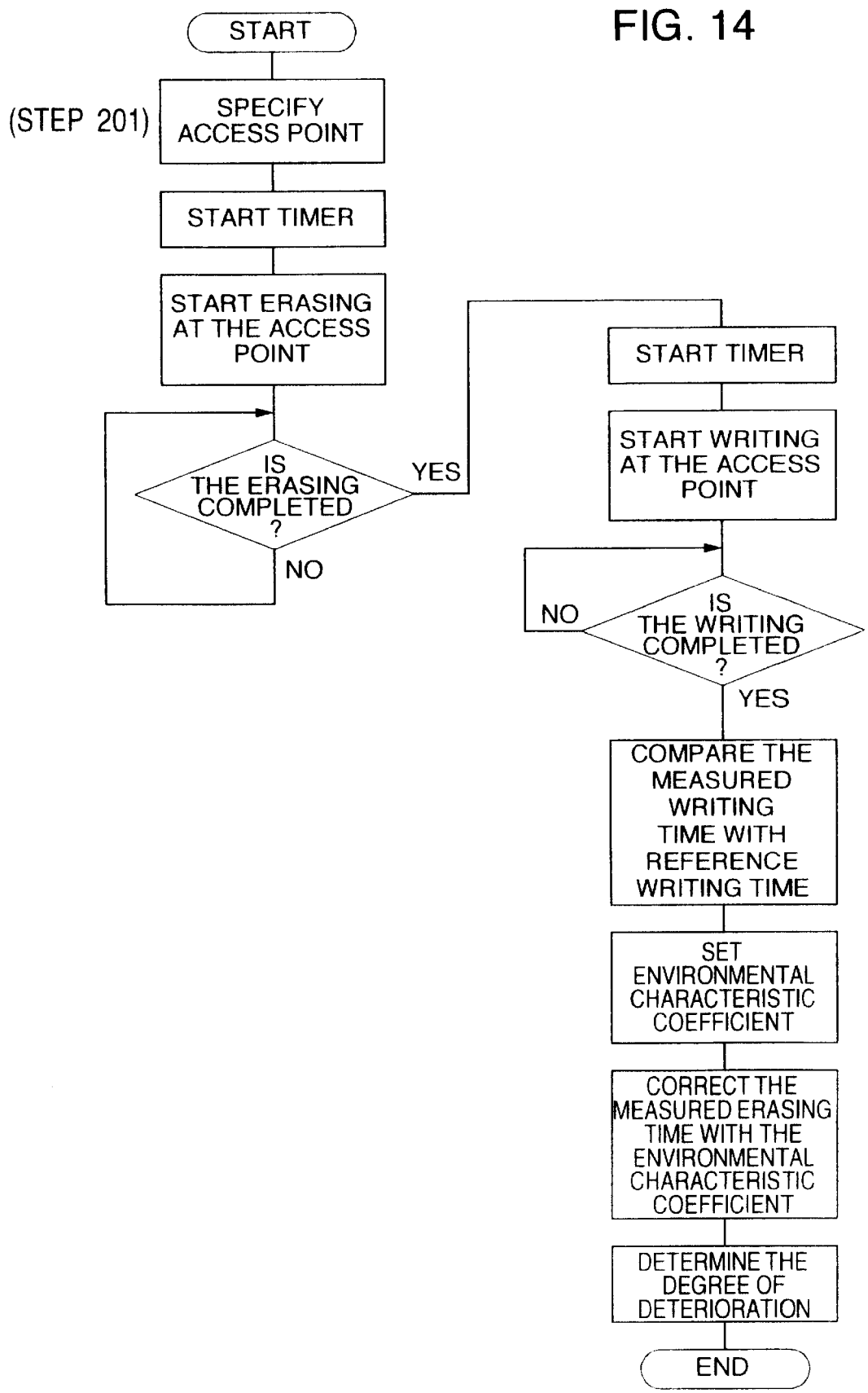
FIG. 14 is a flow chart of a control program in the microcomputer in the case where the nonvolatile memory in which the erasing time increases with the progress of deterioration is used.

Further, in a certain memory, there may be considered the case where the change of the writing time is small and the change of the erasing time is large with the progress of deterioration. In this case, correlation curves shown in FIGS. 11 and 12 are obtained, and the device may be configured as shown in the overall configuration diagram of FIG. 13 and the flow chars of FIG. 14.

Figure 7:
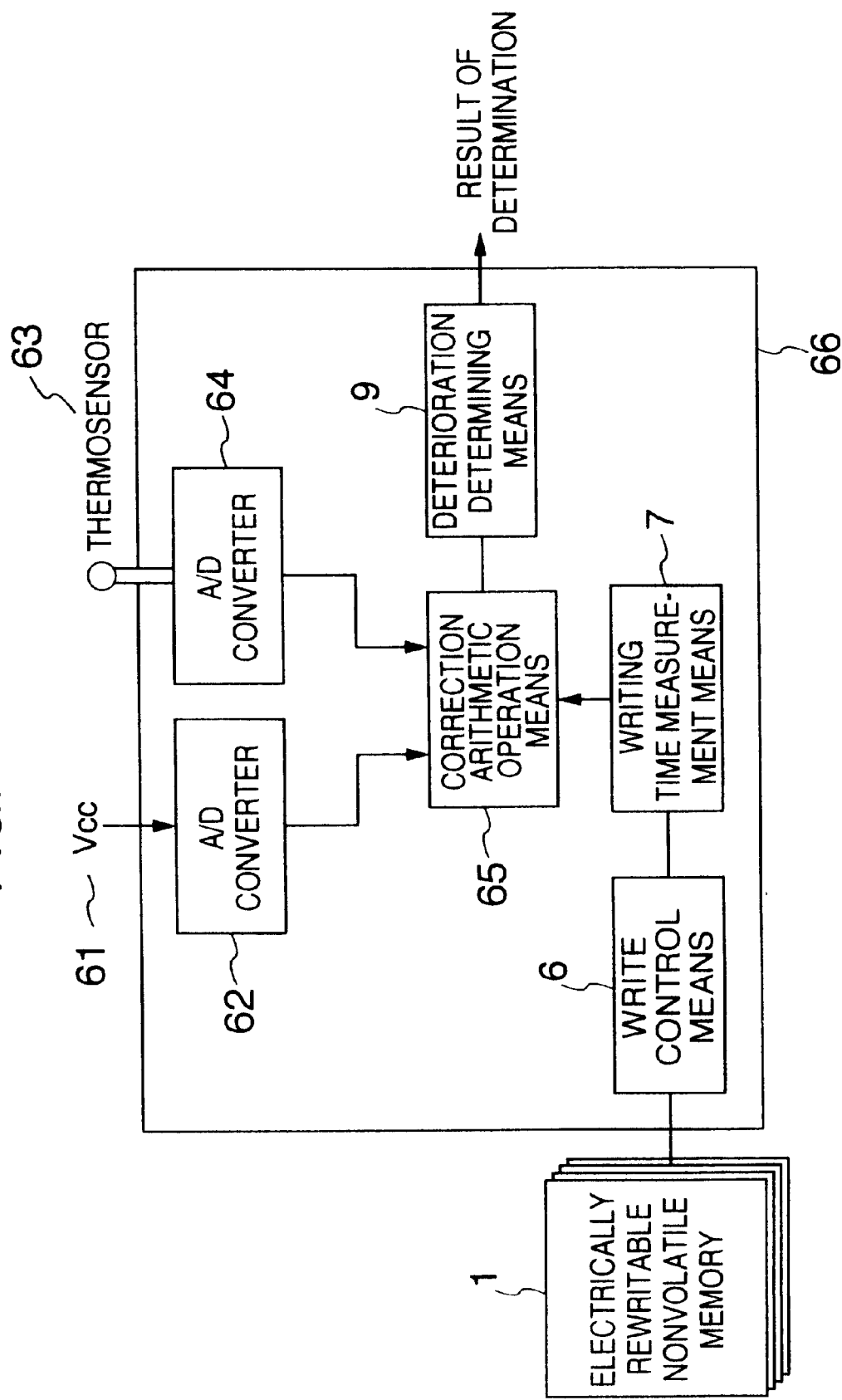
FIG. 7 is a diagram showing an example of configuration of the invention in which environmental characteristic is grasped on the basis of the measurement of the electric source voltage and temperature and the writing time is corrected.

An embodiment in which environmental conditions are detected directly so that correction is performed on the basis of the environmental conditions will be described below. FIG. 7 is a configuration diagram for achieving this embodiment. In FIG. 7, the reference numeral 61 designates an electric source voltage Vcc; 62, an A/D converter circuit for converting the Vcc 61 into a digital value; 63, a thermosensor element for converting a temperature into a resistance value, a current value or a voltage value; 64, an A/D converter circuit for converting the value measured by the thermosensor element into a digital value; 65, a correction arithmetic operation means for correcting the writing time value on the basis of the digital values obtained by the A/D converter circuits 63 and 64; and 66, a deterioration determining device constituted by the aforementioned means. Other aforementioned numerals are as described above.

Figure 15:
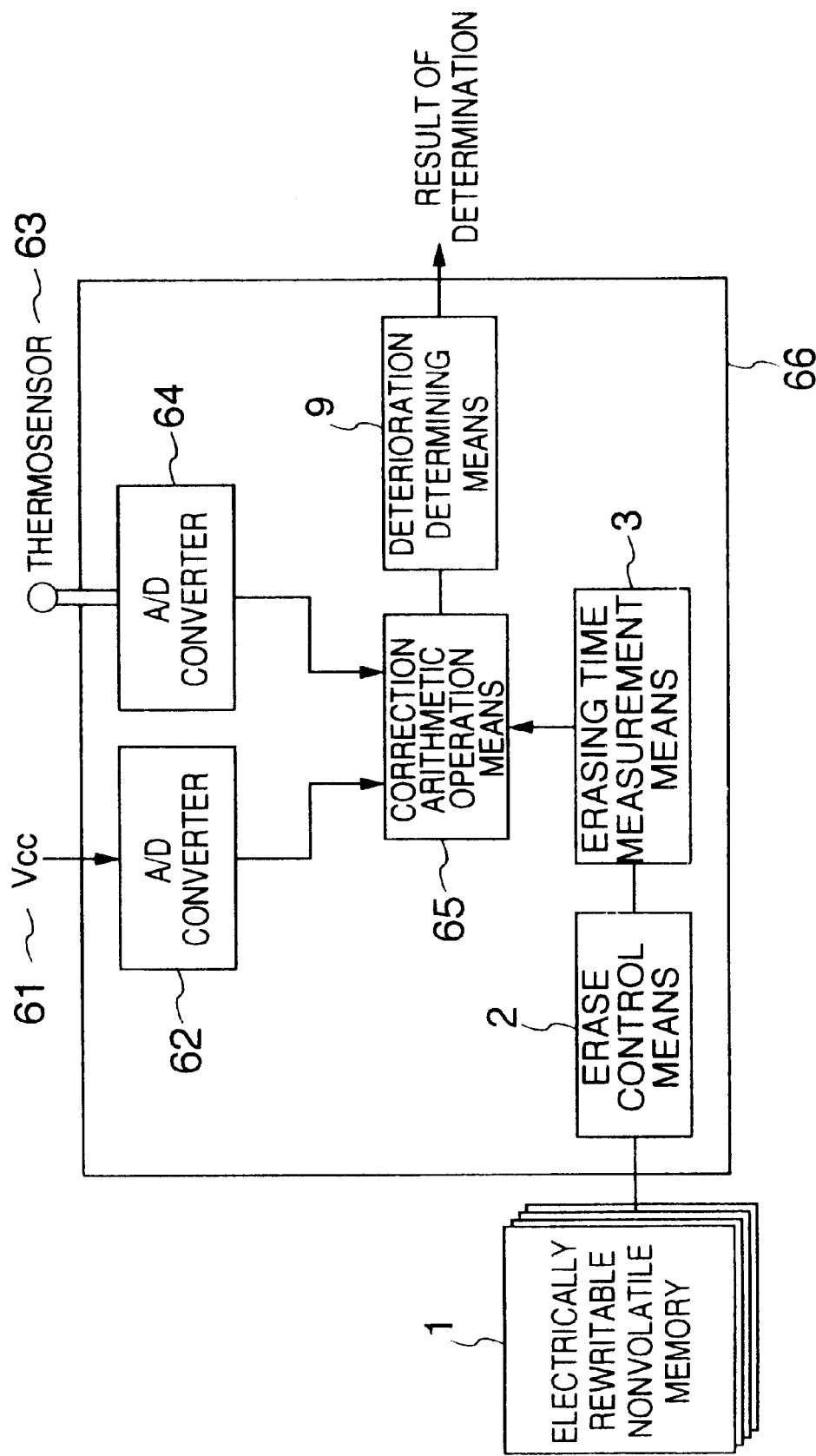
FIG. 15 is a diagram showing an example of configuration of the invention in which environmental characteristic is grasped on the basis of the measurement of the electric source voltage and temperature and the erasing time is corrected.

In this embodiment, the electric source voltage and ambient temperature are measured directly so that the change of environmental conditions is grasped. Accordingly, not only accuracy is improved but also the necessity of measuring the erasing time is eliminated. This is effective in the case where erasing and writing are performed not continuously, that is, in the case where erasing and writing are performed at intervals. Further, this is effective in the case where there is no correlation between the change of the erasing time and the change of the writing time due to the change of environmental conditions or in the case where both the writing time and the erasing time change widely with the progress of the degree of deterioration. Further, use of the erasing time as a subject of determination of deterioration may be rather suitable in accordance with the characteristic of the nonvolatile memory. In this case, the configuration may be as shown in FIG. 15, and the same effect as described above can be obtained if the erasing time is measured and the writing time is corrected in accordance with the environmental conditions. In this embodiment, the circuit scale of the deterioration determining device 66 can be reduced by use of the CPU in the same manner as in FIG. 2.

Figure 8:
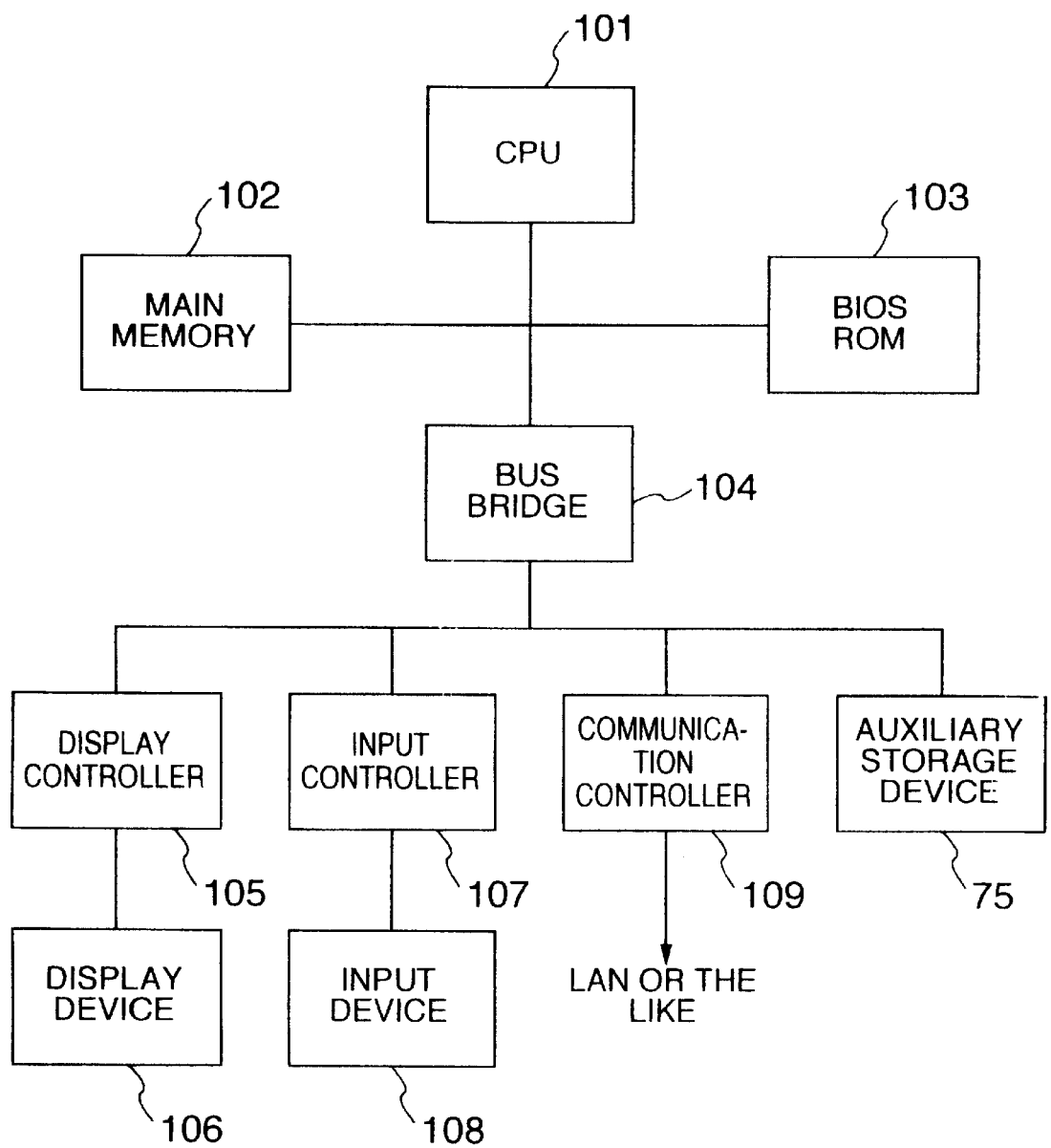
FIG. 8 is an overall configuration diagram in the case where the memory device according to the present invention is applied to an information processing system as an auxiliary storage device.
Figure 9:
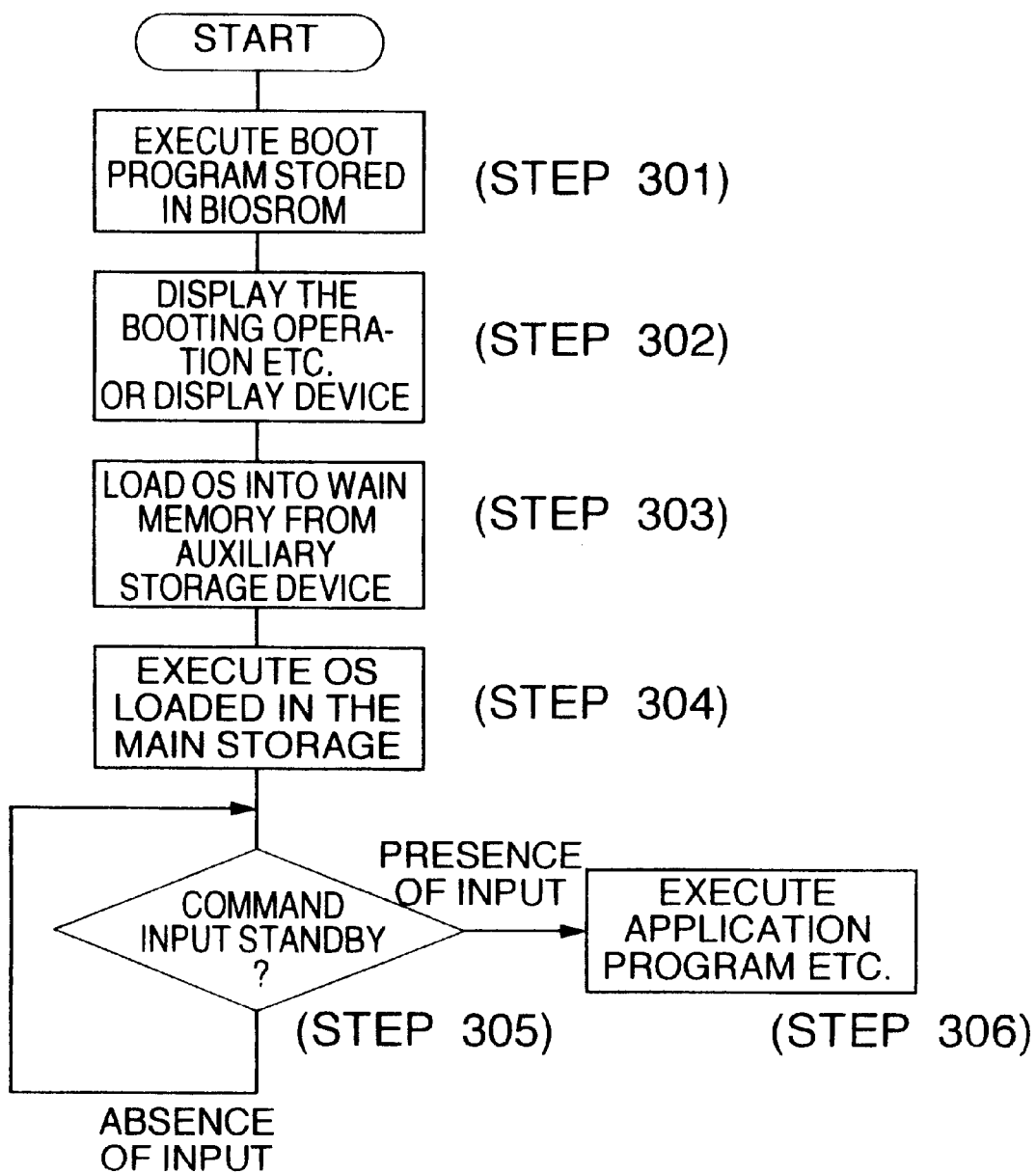
FIG. 9 is a flow chart of the operation of the information processing system depicted in FIG. 8.

FIG. 8 shows the overall configuration diagram of an information processing system as a host to which this storage device is applied. As shown in FIG. 8, a central processing unit 101 (hereinafter referred to as CPU 101) in the information processing system as a host, a memory (hereinafter referred to as BIOSROM) 103 storing a basic input/output program for performing I/O of peripheral devices, and a main memory 102 are connected to a system bus 110. A display controller 105, an input controller 107, a communication controller 109 and an auxiliary storage device 75 are connected to an I/O bus 111. A display device 106 is connected to the display controller 105. An input device 108 is connected to the input controller 107. In this embodiment, the auxiliary storage device 75 described above with reference to FIG. 16 is used as the storage device of the present invention.

When the information processing system in this embodiment is started, the CPU 101 executes a boot program stored in the BIOSROM 103 for booting the system as shown in the flow chart of FIG. 8 (step 301). As a result, the auxiliary storage device 75 is enabled to be accessed. The CPU 101 makes the display device 106 display the state of the booting operation, and so on (step 302). Then, a software program (hereinafter referred to as OS) for generally managing the information processing system is loaded from the auxiliary storage device 75 to the main memory 102 (step 303). The OS loaded to the main memory 102 is executed (step 304). Then, the CPU 101 goes into a command input standby state (step 305). When an instruction to execute an application program, or the like, is given by a user, or the like, the CPU 101 executes it (step 306).

Figure 10:
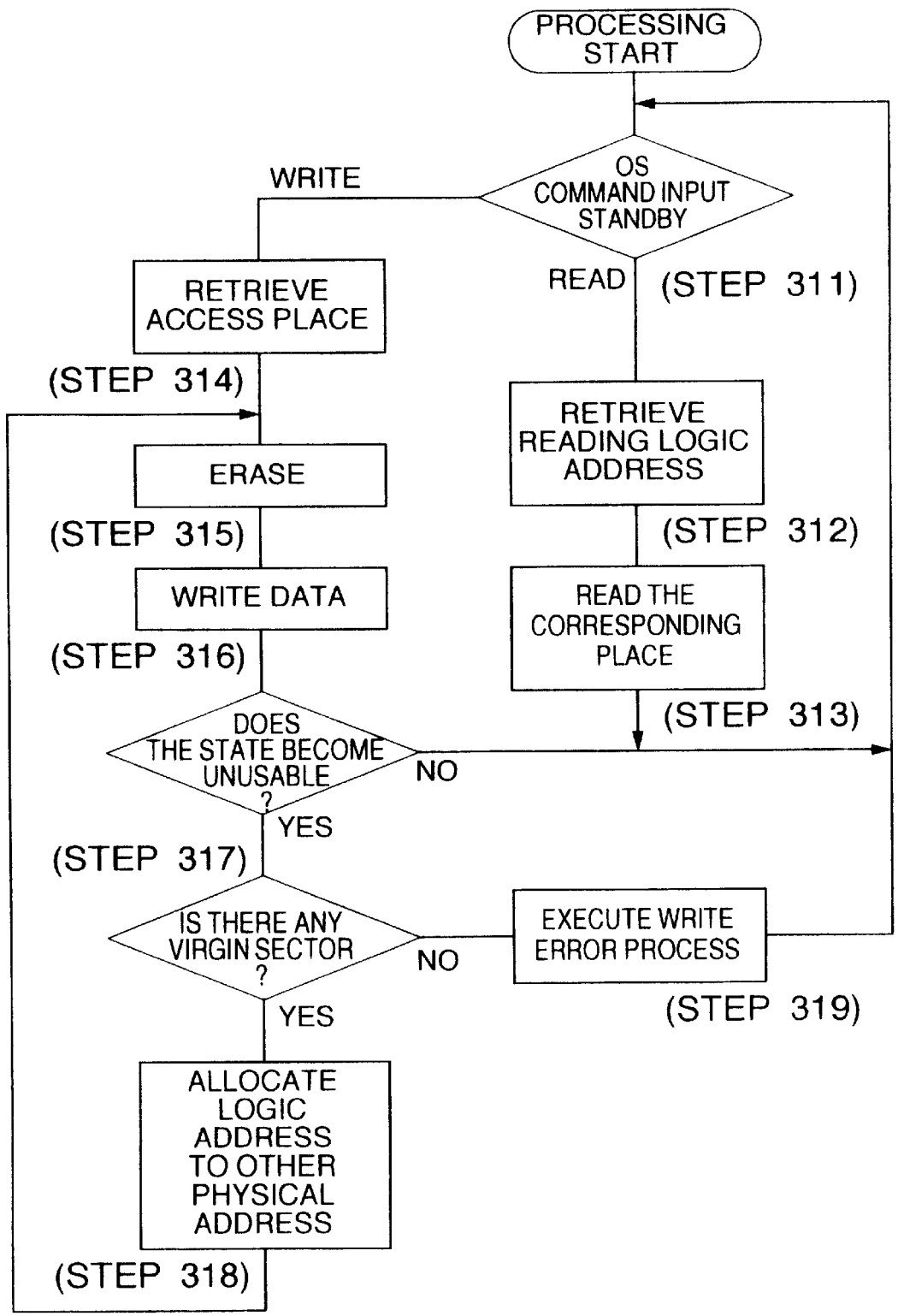
FIG. 10 is a flow chart of the operation of the auxiliary storage device in the information processing system depicted in FIG. 8.

FIG. 10 is a flow chart showing the file writing/ reading operation of the auxiliary storage device 102. Through the system bus 110, the CPU 101 gives the auxiliary storage device 75 a data write/read request, the data and an instruction as for a logical address to which the data is to be written. Upon reception of these, the auxiliary storage device 75 which is in a standby state (step 311) starts a process in accordance with the requested access. If the request is a read request, a physical address is retrieved on the basis of the given logical address (step 312) and a corresponding region is read (step 313). If the request is a write access, a physical address is retrieved or determined on the basis of the given logical address in the same manner as described above (step 314), a corresponding region is erased (step 315), and the given data are written (step 316). In this occasion, the degree of deterioration is determined, so that if the region is in an unusable state (step 317), another region (sector) is allocated and erasing/writing is performed (step 318). If there is no virgin sector in this occasion, a write error process is carried out (step 319). As described above, determination of deterioration according to the present invention is made whenever the erasing/writing routine is carried out. When deterioration has progressed, address swapping, or the like, may be performed. After all processes are completed, the auxiliary storage device 75 goes back into a standby state again.

Industrial Applicability

According to the present invention, deterioration can be determined while the erasing time and writing time are corrected for every region or chip in a nonvolatile memory. Accordingly, the influence of scatter of characteristic is reduced so that substantial deterioration can be determined. As a result, the reliability of the nonvolatile memory is improved so that the nonvolatile memory can be used perfectly until the life of the nonvolatile memory reaches its limit. Furthermore, when the nonvolatile memory according to the present invention is used, an auxiliary storage device of a high reliability and a long life can be provided.

We claim:

1. A semiconductor memory device using an electrically rewritable nonvolatile memory as a storage medium, wherein said memory device comprises:

erasing time measurement means which measures erasing time required for erasing of said nonvolatile memory;

characteristic detection means which compares the erasing time measured by said erasing time measurement means with an erasing time reference value to thereby determine environmental characteristic;

writing time measurement means which measures writing time required for writing of said nonvolatile memory;

correction means which provides correction of the writing time measured by said writing time measurement means on the basis of the environmental characteristic determined by said characteristic detection means; and nonvolatile memory deterioration determining means which determines a degree of deterioration in a rewriting region of said nonvolatile memory on the basis of the corrected writing time.

2. A semiconductor memory device according to claim 1, further comprising:

deterioration-degree storage means which stores a degree of deterioration in every region determined by said nonvolatile memory deterioration determining means while the degree of deterioration in each of the regions is divided into a plurality of stages;

deterioration degree comparing means which compares a degree of deterioration determined at the time of rewriting of each region with the degree of deterioration determined at the time of previous rewriting and stored in said deterioration-degree storage means;

low-deterioration-degree-region retrieval means which detects a region having the lowest degree of deterioration among all regions;

stored data of a region in which progression of deterioration is found as a result of comparison executed by said deterioration degree comparing means; and data exchange means which exchanges the stored data in a region detected by said low-deterioration-degree retrieval means.

3. A semiconductor memory device according to claim 2, wherein, when the corrected erasing time or the corrected writing time exceeds a predetermined value, said nonvolatile memory deterioration determining means makes a determination that the degree of deterioration is in an unusable state and treats the maximum one of the degree of deterioration divided into the plurality of stages as the degree of deterioration in the unusable state to thereby prohibit data storage thereafter.

4. An information processing system comprising:

a central processing unit for performing processing of program or data;

a main memory for temporarily storing said program or data to be used by said central processing unit;

a basic program which stores programs at the time of start and programs such as basic input/output instructions;

display control means and display means which are for displaying of at least a state of operation and a result of a process;

input means which is for inputting a processing request;

communication control means which performs data exchange or the like with other information processing systems; and a semiconductor memory device as defined in claim 3, used as an auxiliary memory device.

5. A semiconductor memory device according to claim 1, wherein said deterioration determining means is provided in the inside of said electrically rewritable nonvolatile memory.

6. A semiconductor memory device using an electrically rewritable nonvolatile memory as a storage medium, wherein said memory device comprises:

electric source voltage detection means which detects an electric source voltage value applied to said nonvolatile memory;

temperature detection means which detects an ambient temperature of said semiconductor memory device;

characteristic detection means which detects environmental characteristic from detection values of said electric source voltage detection means and said temperature detection means;

writing time measurement means which measures writing time required for writing of said nonvolatile memory;

correction means which provides correction of the writing time measured by said writing time measurement means on the basis of the environmental characteristic determined by said characteristic detection means; and nonvolatile memory deterioration determining means which determines a degree of deterioration in a rewriting region of said nonvolatile memory on the basis of the corrected writing time.

7. A semiconductor memory device according to claim 6, wherein said deterioration determining means is provided in the inside of said electrically rewritable nonvolatile memory.

8. A semiconductor memory device according to claim 6, further comprising:

deterioration-degree storage means which stores a degree of deterioration in every region determined by said nonvolatile memory deterioration determining means while the degree of deterioration in each of the regions is divided into a plurality of stages;

deterioration degree comparing means which compares a degree of deterioration determined at the time of rewriting of each region with the degree of deterioration determined at the time of previous rewriting and stored in said deterioration-degree storage means;

low-deterioration-degree-region retrieval means which detects a region having the lowest degree of deterioration among all regions;

stored data of a region in which progression of deterioration is found as a result of comparison executed by said deterioration degree comparing means; and data exchange means which exchanges the stored data in a region detected by said low-deterioration-degree retrieval means.

9. A semiconductor memory device according to claim 8, wherein, when the corrected erasing time or the corrected writing time exceeds a predetermined value, said nonvolatile memory deterioration determining means makes a determination that the degree of deterioration is in an unusable state and treats the maximum one of the degree of deterioration divided into the plurality of stages as the degree of deterioration in the unusable state to thereby prohibit data storage thereafter.

10. An information processing system comprising:

a central processing unit for performing processing of program or data;

a main memory for temporarily storing said program or data to be used by said central processing unit;

a basic program which stores programs at the time of start and programs such as basic input/output instructions;

display control means and display means which are for displaying of at least a state of operation and a result of a process;

input means which is for inputting a processing request;

communication control means which performs data exchange or the like with other information processing systems; and a semiconductor memory device as defined in claim 9, used as an auxiliary memory device.

11. A semiconductor memory device using an electrically rewritable nonvolatile memory as a storage medium, wherein said memory device comprises:

erasing time measurement means which measures erasing time required for erasing of said nonvolatile memory;

writing time measurement means which measures writing time required for writing of said nonvolatile memory;

characteristic detection means which compares the writing time measured by said writing time measurement means with a writing time reference value to thereby determine environmental characteristic;

correction means which provides correction of the erasing time measured by said erasing time measurement means on the basis of the environmental characteristic determined by said characteristic detection means; and nonvolatile memory deterioration determining means which determines a degree of deterioration in a rewriting region of said nonvolatile memory on the basis of the corrected erasing time.

12. A semiconductor memory device according to claim 11, wherein said deterioration determining means is provided in the inside of said electrically rewritable nonvolatile memory.

13. A semiconductor memory device according to claim 11, further comprising:

deterioration-degree storage means which stores a degree of deterioration in every region determined by said nonvolatile memory deterioration determining means while the degree of deterioration in each of the regions is divided into a plurality of stages;

deterioration degree comparing means which compares a degree of deterioration determined at the time of rewriting of each region with the degree of deterioration determined at the time of previous rewriting and stored in said deterioration-degree storage means;

low-deterioration-degree-region retrieval means which detects a region having the lowest degree of deterioration among all regions;

stored data of a region in which progression of deterioration is found as a result of comparison executed by said deterioration degree comparing means; and data exchange means which exchanges the stored data in a region detected by said low-deterioration-degree retrieval means.

14. A semiconductor memory device according to claim 13, wherein, when the corrected erasing time or the corrected writing time exceeds a predetermined value, said nonvolatile memory deterioration determining means makes a determination that the degree of deterioration is in an unusable state and treats the maximum one of the degree of deterioration divided into the plurality of stages as the degree of deterioration in the unusable state to thereby prohibit data storage thereafter.

15. An information processing system comprising:

a central processing unit for performing processing of program or data;

a main memory for temporarily storing said program or data to be used by said central processing unit;

a basic program which stores programs at the time of start and programs such as basic input/output instructions;

display control means and display means which are for displaying of at least a state of operation and a result of a process;

input means which is for inputting a processing request;

communication control means which performs data exchange or the like with other information processing systems; and a semiconductor memory device as defined in claim 14, used as an auxiliary memory device.

16. A semiconductor memory device using an electrically rewritable nonvolatile memory as a storage medium, wherein said memory device comprises:

electric source voltage detection means which detects an electric source voltage value applied to said nonvolatile memory;

temperature detection means which detects an ambient temperature of said semiconductor memory device;

characteristic detection means which determines environmental characteristic from detection values of said electric source voltage detection means and said temperature detection means;

erasing time measurement means which measures erasing time required for erasing of said nonvolatile memory;

correction means which provides correction of the erasing time measured by said erasing time measurement means on the basis of the environmental characteristic determined by said characteristic detection means; and nonvolatile memory deterioration determining means which determines a degree of deterioration in a rewriting region of said nonvolatile memory on the basis of the corrected erasing time.

17. A semiconductor memory device according to claim 16, wherein said deterioration determining means is provided in the inside of said electrically rewritable nonvolatile memory.

18. A semiconductor memory device according to claim 16, further comprising:

deterioration-degree storage means which stores a degree of deterioration in every region determined by said nonvolatile memory deterioration determining means while the degree of deterioration in each of the regions is divided into a plurality of stages;

deterioration degree comparing means which compares a degree of deterioration determined at the time of rewriting of each region with the degree of deterioration determined at the time of previous rewriting and stored in said deterioration-degree storage means;

low-deterioration-degree-region retrieval means which detects a region having the lowest degree of deterioration among all regions;

stored data of a region in which progression of deterioration is found as a result of comparison executed by said deterioration degree comparing means; and data exchange means which exchanges the stored data in a region detected by said low-deterioration-degree retrieval means.

19. A semiconductor memory device according to claim 18, wherein, when the corrected erasing time or the corrected writing time exceeds a predetermined value, said nonvolatile memory deterioration determining means makes a determination that the degree of deterioration is in an unusable state and treats the maximum one of the degree of deterioration divided into the plurality of stages as the degree of deterioration in the unusable state to thereby prohibit data storage thereafter.

20. An information processing system comprising:

a central processing unit for performing processing of program or data;

a main memory for temporarily storing said program or data to be used by said central processing unit;

a basic program which stores programs at the time of start and programs such as basic input/output instructions;

display control means and display means which are for displaying of at least a state of operation and a result of a process;

input means which is for inputting a processing request;

communication control means which performs data exchange or the like with other information processing systems; and a semiconductor memory device as defined in claim 19, used as an auxiliary memory device.

* * * * *